(12) United States Patent
Zheng et al.

(10) Patent No.: US 9,343,870 B2
(45) Date of Patent: May 17, 2016

(54) SEMICONDUCTOR LASER DIODE WITH INTEGRATED HEATING REGION

(71) Applicant: Applied Optoelectronics, Inc., Sugar Land, TX (US)

(72) Inventors: Jun Zheng, Missouri City, TX (US); Klaus Alexander Anselm, Sugar Land, TX (US); Huanlin Zhang, Sugar Land, TX (US); Hung-Lun Chang, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 7 days.

(21) Appl. No.: 14/501,751

(22) Filed: Sep. 30, 2014

(65) Prior Publication Data

US 2016/0094013 A1    Mar. 31, 2016

(51) Int. Cl.
| | |
|---|---|
| *H01S 5/00* | (2006.01) |
| *H01S 5/024* | (2006.01) |
| *H01S 5/026* | (2006.01) |
| *H01S 5/042* | (2006.01) |
| *H01S 5/20* | (2006.01) |
| *H01S 5/10* | (2006.01) |
| *H01S 5/12* | (2006.01) |
| *H01S 5/40* | (2006.01) |
| *G02B 6/12* | (2006.01) |
| *H04B 10/50* | (2013.01) |

(52) U.S. Cl.
CPC .............. *H01S 5/02453* (2013.01); *G02B 6/12* (2013.01); *G02B 6/12014* (2013.01); *H01S 5/0268* (2013.01); *H01S 5/02415* (2013.01); *H01S 5/0425* (2013.01); *H01S 5/1092* (2013.01); *H01S 5/12* (2013.01); *H01S 5/2027* (2013.01); *H01S 5/4087* (2013.01); *H04B 10/503* (2013.01); *G02B 2006/12164* (2013.01)

(58) Field of Classification Search
None
See application file for complete search history.

(56) References Cited

U.S. PATENT DOCUMENTS

| | | | |
|---|---|---|---|
| 5,536,085 A | 7/1996 | Li et al. | |
| 6,714,574 B2 | 3/2004 | Clayton et al. | |
| 7,486,709 B2 * | 2/2009 | Hu ........................ | H01S 5/0261 372/20 |

(Continued)

FOREIGN PATENT DOCUMENTS

DE    4231177 A1    3/1994

OTHER PUBLICATIONS

PCT International Search Report mailed Feb. 2, 2016, received in corresponding PCT Application No. PCT/US15/53103, 13 pgs.

*Primary Examiner* — Hemang Sanghavi
(74) *Attorney, Agent, or Firm* — Grossman Tucker Perreault & Pfleger, PLLC; Norman S. Kinsella (57) ABSTRACT

A semiconductor laser diode with integrated heating generally includes a lasing region and a heating region integrated into the same semiconductor structure or chip. The lasing region and the heating region include first and second portions, respectively, of the semiconductor layers forming the semiconductor structure and include first and second portions, respectively, of the active regions formed by the semiconductor layers. Separate laser and heater electrodes are electrically connected to the respective lasing and heating regions for driving the respective lasing and heating regions with drive currents. The heating region may thus be driven independently from the lasing region, and heat may be conducted through the semiconductor layers from the heating region to the lasing region allowing the temperature to be controlled more efficiently.

19 Claims, 4 Drawing Sheets

(56) References Cited

U.S. PATENT DOCUMENTS

| | | | |
|---|---|---|---|
| 2006/0039427 A1* | 2/2006 | Charles | H01S 5/0261 372/43.01 |
| 2009/0086775 A1 | 4/2009 | Hu et al. | |
| 2014/0241726 A1 | 8/2014 | Ho et al. | |
| 2015/0078411 A1* | 3/2015 | Bismuto | H01S 5/02461 372/44.01 |

* cited by examiner

FIG. 4

SEMICONDUCTOR LASER DIODE WITH INTEGRATED HEATING REGION

TECHNICAL FIELD

The present disclosure relates to semiconductor laser devices for use in optical transmitters and more particularly, to a semiconductor laser diode with an integrated heating region for use in a multi-channel transmitter optical subassembly (TOSA).

BACKGROUND INFORMATION

Fiber optic communications networks may increase the amount of information carried on an optical fiber by multiplexing different optical signals on different wavelengths using wavelength division multiplexing (WDM). In a WDM passive optical network (PON), for example, a trunk fiber carries optical signals at multiple channel wavelengths to and from an optical branching point and the branching point provides a simple routing function by directing signals of different wavelengths to and from individual subscribers. In this case, each subscriber may be assigned one or more of the channel wavelengths on which to send and/or receive data.

To transmit and receive optical signals over multiple channel wavelengths, an optical line terminal (OLT) in a WDM-PON may include a multi-channel transmitter optical subassembly (TOSA) and a multi-channel receiver optical subassembly (ROSA). One example of a TOSA includes a multiplexed laser array that combines multiple optical signals at multiple channel wavelengths. To provide the different channel wavelengths, tunable lasers may be used in the multi-channel TOSA and the wavelengths emitted by the tunable lasers change with changes in temperature. The desired accuracy or precision of the wavelengths in a WDM-PON often depends on the number and spacing of the channel wavelengths and may be controlled in the TOSA by controlling temperature. In a 100 G dense WDM (DWDM) system, for example, the temperature may need to be controlled within ±0.5° C. to maintain a wavelength precision of ±0.05 nm and the temperature range may need to be greater than 4° C. to provide the desired wavelength yield of the laser diodes.

To control the temperature of a tunable laser, one or more resistive heaters may be located proximate the laser, for example, on the same sub-mount as the laser. Such resistive heaters, however, are additional electronic components that take up additional space, increase cost, and may be inefficient in transferring heat to the laser. One challenge with such OLT transceiver modules is providing adequate temperature control of the laser array in a relatively small space and with a relatively low power budget.

BRIEF DESCRIPTION OF THE DRAWINGS

These and other features and advantages will be better understood by reading the following detailed description, taken together with the drawings wherein.

DETAILED DESCRIPTION

A semiconductor laser diode with integrated heating, consistent with the present disclosure, generally includes a lasing region and a heating region integrated into the same semiconductor structure or chip. The lasing region and the heating region include first and second portions, respectively, of the semiconductor layers forming the semiconductor structure and include first and second portions, respectively, of the active regions formed by the semiconductor layers. Separate laser and heater electrodes are electrically connected to the respective lasing and heating regions for driving the respective lasing and heating regions with drive currents. The heating region may thus be driven independently from the lasing region, and heat may be conducted through the semiconductor layers from the heating region to the lasing region allowing the temperature to be controlled more efficiently.

The semiconductor laser device with integrated heating may be used in a temperature controlled multi-channel transmitter optical subassembly (TOSA), which may be used in a multi-channel optical transceiver. The temperature controlled multi-channel TOSA generally includes an array of lasers optically coupled to an optical multiplexer, such as an arrayed waveguide grating (AWG), to combine multiple optical signals at different channel wavelengths. The optical transceiver may be used in a wavelength division multiplexed (WDM) optical system, for example, in an optical line terminal (OLT) in a WDM passive optical network (PON). Although some example embodiments include a multi-channel TOSA, the semiconductor laser device with integrated heating may also be used as a discrete device or in other types of optical transmitters without departing from the example embodiments described herein.

As used herein, "channel wavelengths" refer to the wavelengths associated with optical channels and each channel wavelength may include a specified wavelength band around a center wavelength. In one example, the channel wavelengths may be defined by an International Telecommunication (ITU) standard such as the ITU-T dense wavelength division multiplexing (DWDM) grid. As used herein, "tuning to a channel wavelength" refers to adjusting a laser output such that the emitted laser light includes the channel wavelength. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals. As used herein, "thermally coupled" refers to a direct or indirect connection or contact between two components resulting in heat being conducted from one component to the other component.

Figure 1:
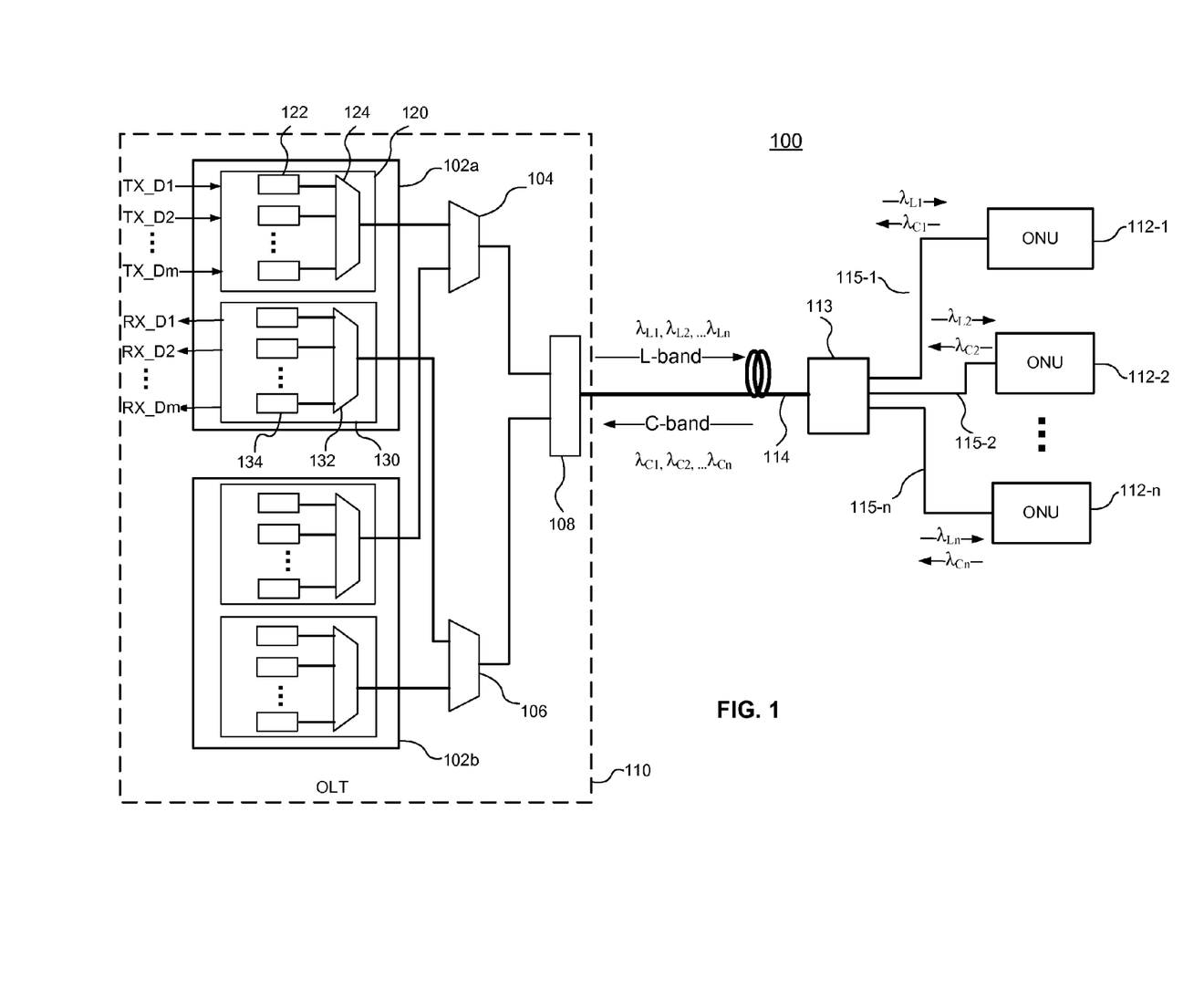
FIG. 1 is a schematic diagram of a wavelength division multiplexed (WDM) passive optical network (PON) including at least one semiconductor laser diode with integrated heating, consistent with an embodiment of the present disclosure.

Referring to FIG. 1, a WDM-PON 100 including one or more multi-channel optical transceivers 102a, 102b may include a multiplexed laser array of one or more semiconductor laser diodes with integrated heating, consistent with embodiments of the present disclosure. The WDM-PON 100 provides a point-to-multipoint optical network architecture using a WDM system. According to one embodiment of the WDM-PON 100, at least one optical line terminal (OLT) 110 may be coupled to a plurality of optical networking terminals (ONTs) or optical networking units (ONUs) 112-1 to 112-n via optical fibers, waveguides, and/or paths 114, 115-1 to 115-n. Although the OLT 110 includes two multi-channel optical transceivers 102a, 102b in the illustrated embodiment, the OLT 110 may include one or more multi-channel optical transceivers.

The OLT 110 may be located at a central office of the WDM-PON 100, and the ONUs 112-1 to 112-n may be located in homes, businesses or other types of subscriber location or premises. A branching point 113 (e.g., a remote node) couples a trunk optical path 114 to the separate optical paths 115-1 to 115-n to the ONUs 112-1 to 112-n at the respective subscriber locations. The branching point 113 may include one or more passive coupling devices such as a splitter or optical multiplexer/demultiplexer. In one example, the ONUs 112-1 to 112-n may be located about 20 km or less from the OLT 110.

The WDM-PON 100 may also include additional nodes or network devices, such as Ethernet PON (EPON) or Gigabit PON (GPON) nodes or devices, coupled between the branching point 113 and ONUs 112-1 to 112-n at different locations or premises. One application of the WDM-PON 100 is to provide fiber-to-the-home (FTTH) or fiber-to-the-premises (FTTP) capable of delivering voice, data, and/or video services across a common platform. In this application, the central office may be coupled to one or more sources or networks providing the voice, data and/or video.

In the WDM-PON 100, different ONUs 112-1 to 112-n may be assigned different channel wavelengths for transmitting and receiving optical signals. In one embodiment, the WDM-PON 100 may use different wavelength bands for transmission of downstream and upstream optical signals relative to the OLT 110 to avoid interference between the received signal and back reflected transmission signal on the same fiber. For example, the L-band (e.g., about 1565 to 1625 nm) may be used for downstream transmissions from the OLT 110 and the C-band (e.g., about 1530 to 1565 nm) may be used for upstream transmissions to the OLT 110. The upstream and/or downstream channel wavelengths may generally correspond to the ITU grid. In one example, the upstream wavelengths may be aligned with the 100 GHz ITU grid and the downstream wavelengths may be slightly offset from the 100 GHz ITU grid.

The ONUs 112-1 to 112-n may thus be assigned different channel wavelengths within the L-band and within the C-band. Transceivers or receivers located within the ONUs 112-1 to 112-n may be configured to receive an optical signal on at least one channel wavelength in the L-band (e.g., $\lambda_{L1}$, $\lambda_{L2}$, ... $\lambda_{Ln}$). Transceivers or transmitters located within the ONUs 112-1 to 112-n may be configured to transmit an optical signal on at least one channel wavelength in the C-band (e.g., $\lambda_{C1}$, $\lambda_{C2}$, ... $\lambda_{Cn}$). Other wavelengths and wavelength bands are also within the scope of the system and method described herein.

The branching point 113 may demultiplex a downstream WDM optical signal (e.g., $\lambda_{L1}$, $\lambda_{L2}$, ... $\lambda_{Ln}$) from the OLT 110 for transmission of the separate channel wavelengths to the respective ONUs 112-1 to 112-n. Alternatively, the branching point 113 may provide the downstream WDM optical signal to each of the ONUs 112-1 to 112-n and each of the ONUs 112-1 to 112-n separates and processes the assigned optical channel wavelength. The individual optical signals may be encrypted to prevent eavesdropping on optical channels not assigned to a particular ONU. The branching point 113 also combines or multiplexes the upstream optical signals from the respective ONUs 112-1 to 112-n for transmission as an upstream WDM optical signal (e.g., $\lambda_{C1}$, $\lambda_{C2}$, ... $\lambda_{Cn}$) over the trunk optical path 114 to the OLT 110.

The OLT 110 may be configured to generate multiple optical signals at different channel wavelengths (e.g., $\lambda_{L1}$, $\lambda_{L2}$, ... $\lambda_{Cn}$) and to combine the optical signals into the downstream WDM optical signal carried on the trunk optical fiber or path 114. Each of the OLT multi-channel optical transceivers 102a, 102b may include a multi-channel transmitter optical subassembly (TOSA) 120 for generating and combining the optical signals at the multiple channel wavelengths. The OLT 110 may also be configured to separate optical signals at different channel wavelengths (e.g., $\lambda_{C1}$, $\lambda_{C2}$, ... $\lambda_{Cn}$) from an upstream WDM optical signal carried on the trunk path 114 and to receive the separated optical signals. Each of the OLT multi-channel optical transceivers 102a, 102b may thus include a multi-channel receiver optical subassembly (ROSA) 130 for separating and receiving the optical signals at multiple channel wavelengths.

One embodiment of the multi-channel TOSA 120 includes a laser array 122, such as an array of one or more semiconductor laser diodes with integrated heating, which may be modulated by respective RF data signals (TX_D1 to TX_Dm) to generate the respective optical signals. The laser array 122 may be modulated using various modulation techniques including external modulation and direct modulation. An optical multiplexer 124, such as an arrayed waveguide grating (AWG), combines the optical signals at the different respective downstream channel wavelengths (e.g., $\lambda_{L1}$, $\lambda_{L2}$, ... $\lambda_{Lm}$). The temperature at various locations along the laser array 122 may be monitored and controlled to maintain a desired wavelength precision or accuracy.

In some embodiments, the laser array 122 may include tunable lasers that generate the optical signals at the respective channel wavelengths. In other embodiments, the laser array 122 may include lasers that generate optical signals over a band of channel wavelengths and filtering and/or multiplexing techniques may be used to produce the assigned channel wavelengths. Examples of optical transmitters including a laser array and AWG are disclosed in greater detail in U.S. patent application Ser. No. 13/543,310 (U.S. Patent Application Pub. No. 2013-0016971), U.S. patent application Ser. No. 13/357,130 (U.S. Patent Application Pub. No. 2013-0016977), and U.S. patent application Ser. No. 13/595,505 (U.S. Patent Application Pub. No. 20130223844), all of which are fully incorporated herein by reference. In the illustrated embodiment, the OLT 110 further includes a multiplexer 104 for multiplexing the multiplexed optical signal from the multi-channel TOSA 120 in the multi-channel transceiver 102a with a multiplexed optical signal from a multi-channel TOSA in the other multi-channel transceiver 102b to produce the downstream aggregate WDM optical signal.

One embodiment of the multi-channel ROSA 130 includes a demultiplexer 132 for separating the respective upstream channel wavelengths (e.g., $\lambda_{C1}$, $\lambda_{C2}$, ... $\lambda_{Cn}$). An array of photodetectors 134, such as photodiodes, detects the optical signals at the respective separated upstream channel wavelengths and provides the received data signals (RX_D1 to RX_Dm). In the illustrated embodiment, the OLT 110 further includes a demultiplexer 106 for demultiplexing the upstream WDM optical signal into first and second WDM optical signals provided to the respective multi-channel ROSA in each of the transceivers 102a, 102b. The OLT 110 also includes a diplexer 108 between the trunk path 114 and the multiplexer 104 and the demultiplexer 106 such that the trunk path 114 carries both the upstream and the downstream channel wavelengths. The transceivers 102a, 102b may also include other components, such as laser drivers, transimpedance amplifiers (TIAs), and control interfaces, used for transmitting and receiving optical signals.

In one example, each of the multi-channel optical transceivers 102a, 102b may be configured to transmit and receive 16 channels such that the WDM-PON 100 supports 32 downstream L-band channel wavelengths and 32 upstream C-band channel wavelengths. As mentioned above, the upstream and downstream channel wavelengths may span a range of channel wavelengths on the 100 GHz ITU grid. Each of the transceivers 102a, 102b, for example, may cover 16 channel wavelengths in the L-band for the TOSA and 16 channel wavelengths in the C-band for the ROSA such that the transceivers 102a, 102b together cover 32 channels. Thus, the multiplexer 104 may combine 16 channels from one transceiver 102a with 16 channels from the other transceiver 102b, and the demultiplexer 106 may separate a 32 channel WDM optical signal into two 16 channel WDM optical signals. According to one example of a multi-channel optical transceiver used in the WDM-PON 100, the desired wavelength precision or accuracy is ±0.05 nm, the desired operating temperature is between −5 and 70° C., and the desired power dissipation is about 16.0 W.

Figure 2:
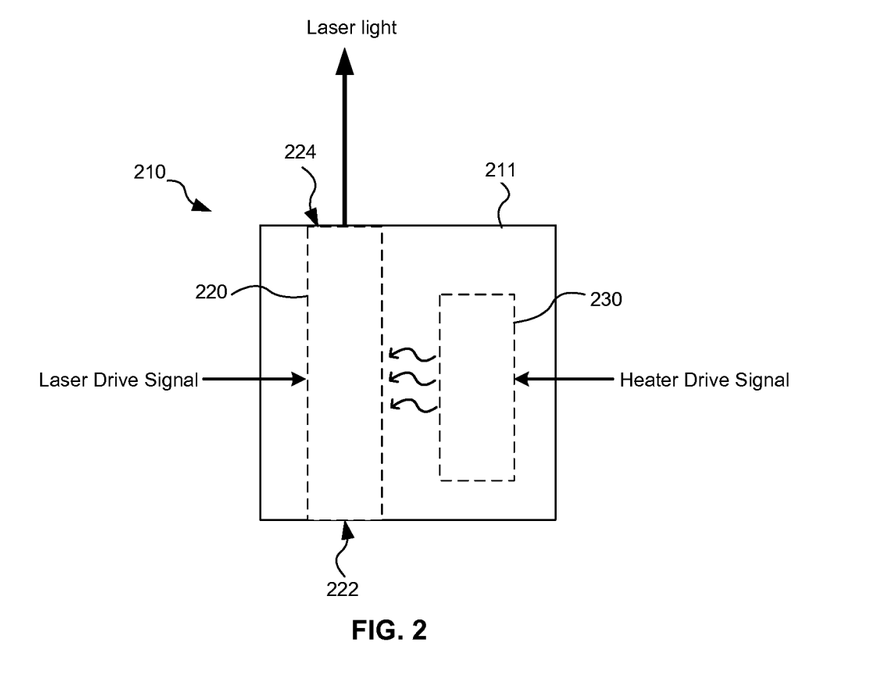
FIG. 2 is a schematic diagram of a semiconductor laser diode with integrated heating, consistent with embodiments of the present disclosure.

Referring to FIG. 2, a semiconductor laser diode 210 with integrated heating, consistent with embodiments of the present disclosure, generally includes a lasing region 220 and a heating region 230 integrated into the same semiconductor chip or structure 211. The lasing region 220 and the heating region 230 may include first and second portions of the semiconductor layers forming the semiconductor structure 211, as will be described in greater detail below. The heating region 230 is thus thermally coupled to the lasing region 220 through the semiconductor structure 211, which conducts heat from the heating region 230 to the lasing region 220. In the illustrated embodiment, the lasing region 220 includes a back reflector 222 and an exit reflector 224 forming a lasing cavity such that laser light exits through the exit reflector 224. In other embodiments, the exit reflector 224 may be separate from the semiconductor laser diode 210 such that the lasing region 220 forms an external cavity laser.

The lasing region 220 and the heating region 230, respectively, are configured to receive a laser drive signal and a heater drive signal. The laser drive signal applies a current to the lasing region 220 such that an active region of the semiconductor layers in the lasing region 220 generates light as the current travels through the semiconductor layers. The laser drive signal may be modulated with data according to known modulation techniques to provide a modulated optical signal emitted from the lasing region 220.

The heater drive signal applies a current to the heating region 230 such that an active region of the semiconductor layers in the heating region 230 generates heat as the current travels through the semiconductor layers. The heating region 230 has a similar semiconductor diode structure as the lasing region 220 and thus may also generate light but is driven for purposes of generating heat. The heat generated by the heating region 230 is related to the electric power (i.e., V*I) and thus the current (I) may be varied to vary the amount of heat generated. In one example, the heater drive signal may apply a current in a range of 0 to 100 mA to provide a desired heat output.

The wavelength of the laser light emitted by the lasing region 220 varies in response to temperature changes. The heating region 230 may thus be used, for example, together with a temperature control system including a thermoelectric cooler (TEC), to provide wavelength stabilization and/or wavelength tuning of laser light emitted by the lasing region 220. In one embodiment, the semiconductor laser diode 210 with integrated heating may be used in a temperature controlled multi-channel TOSA such as the type described in U.S. Patent Application Publication No. 2014/0241726 filed Feb. 22, 2013, which is commonly-owned and fully incorporated herein by reference.

Figure 3A:
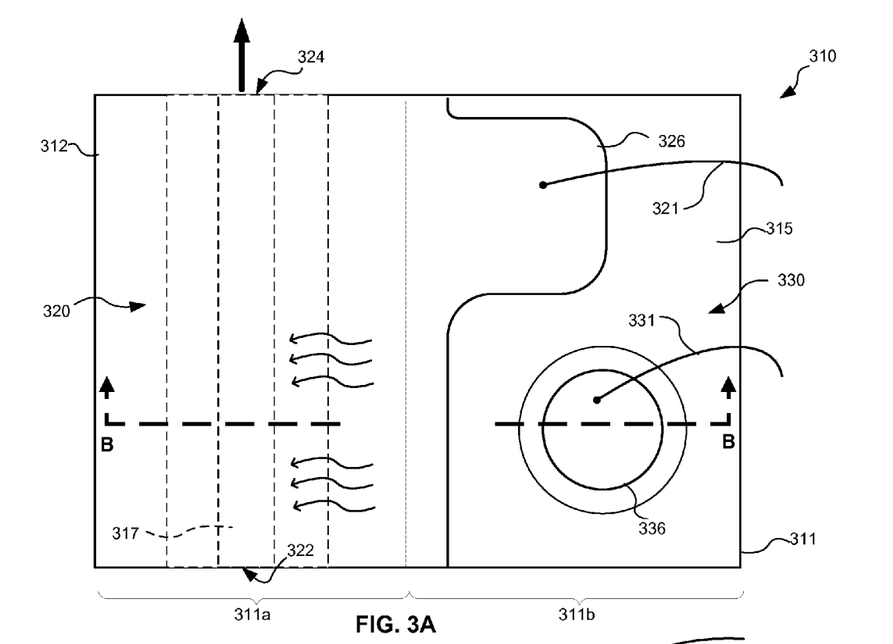
FIG. 3A is a top view of one embodiment of a semiconductor laser diode with integrated heating.
Figure 3B:
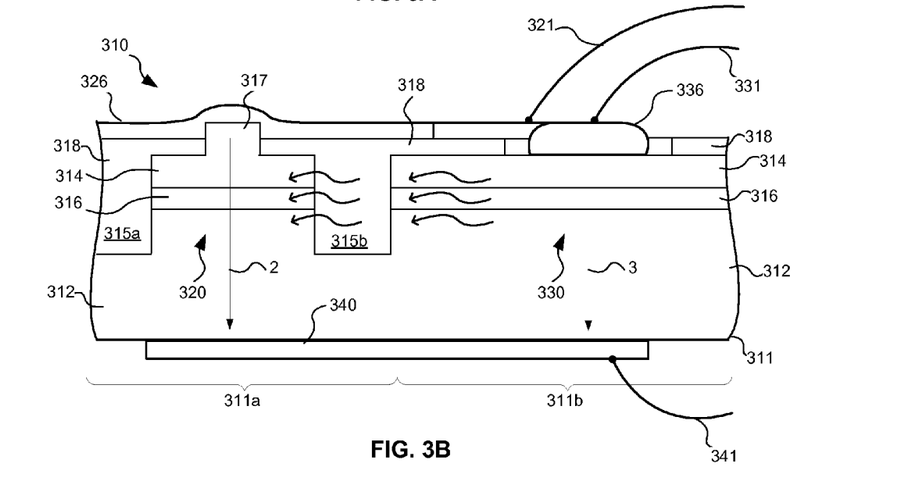
FIG. 3B is a cross-sectional view of the semiconductor laser diode of FIG. 3A taken along line B-B.

Referring to FIGS. 3A and 3B, one embodiment of a semiconductor laser diode 310 with integrated heating is described in greater detail. In general, the laser diode 310 includes a lasing region 320 and a heating region 330 integrated into the same semiconductor chip or structure 311, for example, in respective first and second portions 311a, 311b of the semiconductor structure 311. The semiconductor structure 311 includes a plurality of semiconductor layers 312, 314 forming an active region 316 (also referred to as a gain region) at the junction between the semiconductor layers 312, 314. Thus, the lasing region 320 includes the semiconductor layers 312, 314 and the active region 316 in the first portion 311a of the semiconductor structure 311 and the heating region 330 includes the semiconductor layers 312, 314 and the active region 316 in the second portion 311b of the semiconductor structure 311.

A laser electrode 326 is located on an outer surface of the first portion 311a and electrically coupled to the lasing region 320 in the first semiconductor portion 311a. A heater electrode 336 is located on an outer surface of the second semiconductor portion 311b and electrically coupled to the heating region 330 in the second semiconductor portion 311b. The laser electrode 326 and the heater electrode 336 are separated and isolated from each other for independently applying drive currents to the lasing region 320 and the heating region 330, respectively. At least one bottom electrode 340 is located on an opposite side of the semiconductor structure 311. The electrodes 326, 336, 340 may be formed as metal contacts using a conductive metal such as gold.

Wires 321, 331 may be wirebonded to the respective laser electrode 326 and heater electrode 336 to provide the drive currents for the respective laser drive signal and heater drive signal. One or more wires 341 may also be wirebonded to the bottom electrode 340. Although the illustrated embodiment shows a particular size and shape for the electrodes 326, 336, 340, the electrodes 326, 336, 340 may have other sizes and shapes. Instead of a common bottom electrode 340 covering the whole bottom of the semiconductor structure 311, the semiconductor laser diode 310 may include separate electrodes on the bottom corresponding to the laser electrode 326 and the heater electrode 336.

Current is applied to the laser electrode 326 and the heater electrode 336 (e.g., the laser and heater drive signals) such that current travels from the laser electrode 326 and the heater electrode 336, respectively, through the semiconductor layers 312, 314 to the bottom electrode 340 as indicated by arrows 2, 3. In other embodiments, the drive current may be applied to electrodes on the bottom of the semiconductor laser diode 310 such that current travels from the bottom to the top.

The lasing region 320 generates and emits laser light in response to the laser drive signal, for example, to produce a modulated optical signal as generally known to those skilled in the art. In the heating region 330, heat is generated where the current flows through the semiconductor layers 312, 314 and the active region 316. This heat is then conducted through the semiconductor structure 311 from the second portion 311b to the first portion 311a to heat the lasing region 320. Because the semiconductor structure 311 is relatively small and the semiconductor materials may have good thermal conductivity, the heat transfer may be more efficient and localized than when using a separate resistive heater proximate a laser diode.

The semiconductor laser diode 310 may include one or more n-type semiconductor layers 312 and one or more p-type semiconductor layers 314. The active region 316 is generally formed at a junction of the n-type semiconductor layer(s) 312 and the p-type semiconductor layer(s) 314 and may include an intrinsic layer between the n-type semiconductor layer(s) 312 and the p-type semiconductor layer(s) 314 forming a PIN junction. The semiconductor structure 311 may form, for example, a quantum well laser or multiple quantum well laser in the lasing region 320. The semiconductor layers 312, 314 may include any semiconductor material used in semiconductor laser diodes including, without limitation, indium phosphide (InP), gallium arsenide (GaAs), and gallium nitride (GaN). In particular, InP may be used to provide good thermal conductivity between the heating region 330 and the lasing region 320.

In the illustrated embodiment, the lasing region 320 of the semiconductor structure 311 is formed as a mesa, for example, by etching trenches 315a, 315b on each side of the lasing region 320 to isolate the active region 316 in the lasing region 320. The heating region 330 is thus formed on the other side of the trench 315b in an otherwise unused portion of the semiconductor structure 311. An insulating layer 318 fills the trenches 315a, 315b and covers a substantial portion of the p-type semiconductor layer 314 except for the locations where the laser electrode 326 and the heater electrode 336 contact the p-type semiconductor layer 314. The insulating layer 318 may include an insulating material such as silicon dioxide ($SiO_2$).

In this embodiment, the p-type semiconductor layer 314 in the first portion 311a of the semiconductor structure 311 is formed with a ridge 317 extending along the length of the lasing region 320 and extending through the insulating layer 318 such that the laser electrode 326 is electrically coupled to the active region 316 in the first portion 311a via the ridge 317. In this embodiment, the heater electrode 336 is directly deposited on the p-type semiconductor layer 314 and is surrounded by the insulating layer 318 such that the heater electrode 336 is electrically isolated from the laser electrode 326.

The lasing region 320 may be in the form of various types of semiconductor laser diodes including, without limitation, a broad spectrum Fabry-Perot (FP) laser or a narrow spectrum distributed feedback (DFB) laser or distributed Bragg reflector (DBR) laser. In some embodiments, the lasing region may be capable of emitting a range of wavelengths across a full spectrum of channel wavelengths in a WDM optical system (e.g., the C-band, the L-band, or both) or a subset of channel wavelengths in the WDM optical system. The lasing region 320 may also be tunable across a range of wavelengths.

In the illustrated embodiment, the lasing region 320 includes a back reflector 322 and an exit reflector 324 located on each end of the semiconductor layers 312, 314 in the first portion 311a of the semiconductor structure 311. The back reflector 322 may be highly reflective (e.g., at least 80% reflective) and may include, for example, a highly reflective coating, a thin film reflector, or a fiber grating. In one embodiment, the back reflector 322 may be about 80-90% reflectivity to allow a portion of light to pass through the back for sensing by a monitor photodiode (not shown). The exit reflector 324 may have a partial reflectivity (e.g., about 50%) sufficient to achieve lasing at the associated channel wavelength(s). The exit reflector 324 may include a reflective coating on the chip or a distributed Bragg reflector (DBR) on the chip or separate from the chip.

In other embodiments, an anti-reflective (AR) coating may be used instead of the exit reflector 324 and an external exit reflector may be used such that the lasing region 320 forms an external cavity laser. The anti-reflective coating may include a high quality anti-reflective (AR) coating on the other facet of the semiconductor structure 311 in the lasing region 320 such that light passes out of the lasing region 320 without reflection or with a reflectivity as small as possible (e.g., less than 1% reflective).

The semiconductor laser diode 310 may be formed using known semiconductor manufacturing techniques. The semiconductor layers 312, 314 may be deposited and then etched to form the trenches 315a, 315b and the ridge 317. The insulating layer 318 may then be deposited over the semiconductor layer 316 and within the trenches 315a, 317b. Portions of the insulating layer 318 may be etched and removed to expose the outer semiconductor layer 314 in the lasing region 320 (i.e., the ridge 317) and the heating region 330. The conductive metal may be deposited on the exposed regions to form the laser electrode 326 and the heater electrode 336. Conductive metal may also be deposited on the bottom of the outer semiconductor layer 312 to form the bottom electrode 340. The wires 321, 331, 341 may then be wirebonded to the electrodes 326, 336, 340, respectively.

Figure 4:
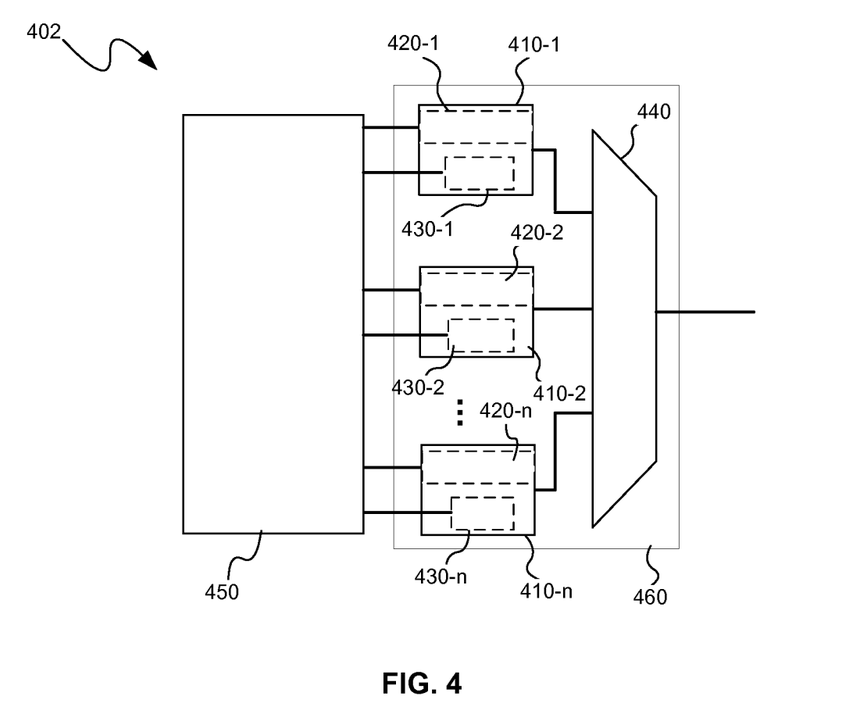
FIG. 4 is a schematic diagram of a multi-channel transmitter optical subassembly (TOSA) including an array of semiconductor laser diodes with integrated heating, consistent with embodiments of the present disclosure.

FIG. 4 shows one embodiment of a multi-channel TOSA 402 including an array of semiconductor laser diodes 410-1 to 410-n with integrated heating. In this embodiment, the semiconductor laser diodes 410-1 to 410-n are optically coupled to an optical multiplexer 440, such as an arrayed waveguide grating (AWG), which combines the optical signals output from each of the semiconductor laser diodes 410-1 to 410-n to provide a multiplexed optical signal. In this embodiment, each of the semiconductor laser diodes 410-1 to 410-n includes a lasing region 420-1 to 420-n and a heating region 430-1 to 430-n, for example, as described above. In other embodiments, the multi-channel TOSA 402 may also include other types of lasers.

The semiconductor laser diodes 410-1 to 410-n are also electrically coupled to drive circuitry 450 configured to provide laser drive signals and heater drive signals to control the lasers and the heating, respectively, in the semiconductor laser diodes 410-1 to 410-n. The laser drive signals may include modulated electrical signals such as the type known to those skilled in the art. The heater drive signals may include electrical signals with a current level set to provide a desired amount of heating within a respective heating region 430-1 to 430-n. The drive circuitry 450 may generate the heater drive signals in response to a monitored temperature or other feedback, for example, to provide sufficient heating from the heating region(s) to adjust or stabilize a wavelength of the light emitted from the corresponding lasing region(s).

In one embodiment, the semiconductor laser diodes 410-1 to 410-n with integrated heating may be used in a temperature control system that controls the wavelengths of each of the semiconductor laser diodes 410-1 to 410-n by heating and/or cooling. A temperature control system may include, for example, a thermoelectric cooler (TEC) 460 that is thermally coupled to the semiconductor laser diodes 410-1 to 410-n and/or the optical multiplexer 440. One example of such a system is described in U.S. Patent Application Publication No. 2014/0241726 filed Feb. 22, 2013, which is commonly-owned and fully incorporated herein by reference.

Accordingly, a semiconductor laser diode with integrated heating, consistent with embodiments described herein, may be used to provide temperature control of a laser wavelength with more efficient heat transfer.

Consistent with one embodiment, a semiconductor laser diode with integrated heating includes a plurality of semiconductor layers forming at least one active region. The semiconductor laser diode includes a lasing region including a first portion of the semiconductor layers and the active region and configured to emit laser light. A laser electrode is located on an outer surface of the first portion of the semiconductor layers and electrically coupled to the lasing region in the first portion of the semiconductor layers. The semiconductor laser diode further includes a heating region including a second portion of the semiconductor layers and the active region. The heating region is configured to generate heat and is thermally coupled to the lasing region such that heat generated by the heating region is conducted to the lasing region. A heater electrode is located on an outer surface of the second portion of the semiconductor layers and is electrically coupled to the heating region in the second portion of the semiconductor layers. The heater electrode is separated from the laser electrode.

Consistent with another embodiment, a multi-channel transmitter optical subassembly (TOSA) includes an array of semiconductor laser diodes configured to generate laser light associated with a plurality of optical channels. At least one of the semiconductor laser diodes is a semiconductor laser diode with integrated heating as described above. The multi-channel TOSA also includes an optical multiplexer optically coupled to the array of semiconductor laser diodes. The optical multiplexer is configured to combine the laser light at different respective channel wavelengths. The multi-channel TOSA further includes drive circuitry electrically coupled to the laser electrode and the heater electrode. The drive circuitry is configured to provide a laser drive signal to the lasing region and a heater drive signal to the heater region.

Consistent with a further embodiment, a method is provided for manufacturing a semiconductor laser diode. The method includes: providing a plurality of semiconductor layers forming an active region; forming a lasing region in a first portion of the semiconductor layers and a heating region in a second portion of the semiconductor layers, the lasing region including a first portion of the active region and the heating region including a second portion of the active region; depositing a laser electrode on an outer surface of the semiconductor layers in the first portion, wherein the laser electrode is electrically coupled to the lasing region in the first portion of the semiconductor layers; depositing a heater electrode on an outer surface of the semiconductor layers in the second portion, wherein the heater electrode is electrically coupled to the heating region in the second portion of the semiconductor layers; and depositing at least one bottom electrode on an outer surface of the semiconductor layers opposite the laser electrode and the heater electrode.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A semiconductor laser diode with integrated heating, the semiconductor laser diode comprising:
    a plurality of semiconductor layers forming at least one active region;
    a lasing region including a first portion of the semiconductor layers and the active region, wherein the lasing region is configured to emit laser light;
    a laser electrode located on an outer surface of the first portion of the semiconductor layers and electrically coupled to the lasing region in the first portion of the semiconductor layers;
    a heating region including a second portion of the semiconductor layers and the active region, wherein the heating region is configured to generate heat, and wherein the heating region is thermally coupled to the lasing region such that heat generated by the heating region is conducted to the lasing region;
    a heater electrode located on an outer surface of the second portion of the semiconductor layers and electrically coupled to the heating region in the second portion of the semiconductor layers, wherein the heater electrode is separated from the laser electrode; and wherein the first portion of the active region in the lasting region is isolated from the second portion of the active region in the heating region.

2. The semiconductor laser diode of claim 1 wherein the semiconductor layers include at least one p-type semiconductor layer and at least one n-type semiconductor layer.

3. The semiconductor laser diode of claim 2 wherein the semiconductor layers further include an intrinsic layer forming the active region between the at least one p-type semiconductor layer and the at least one n-type semiconductor layer.

4. The semiconductor laser diode of claim 1 further including an insulating layer to isolate the first portion of the active region in the lasing region, wherein the insulating layer is located in at least one trench formed through at least a portion of the semiconductor layers between the lasing region and the heating region.

5. The semiconductor laser diode of claim 4 wherein the insulating layer isolates the laser electrode from the heater electrode.

6. The semiconductor laser diode of claim 1 wherein the lasing region includes a back reflector and an exit reflector on each end of the first portion of the active region to form a lasing cavity.

7. The semiconductor laser diode of claim 1 further comprising at least one bottom electrode on a side of the semiconductor layers opposite the lasing electrode and the heating electrode.

8. The semiconductor laser diode of claim 1 wherein the lasing region is configured to emit different wavelengths of laser light at different temperatures.

9. The semiconductor laser diode of claim 1 wherein an outer semiconductor layer includes a ridge along the lasing region, and wherein the laser electrode is located on and electrically coupled to the ridge.

10. A multi-channel transmitter optical subassembly (TOSA) comprising:
    an array of semiconductor laser diodes configured to generate laser light associated with a plurality of optical channels, at least one of the semiconductor laser diodes including:
        a plurality of semiconductor layers forming at least one active region;
        a lasing region including a first portion of the semiconductor layers and the active region, wherein the lasing region is configured to emit laser light;
        a laser electrode located on an outer surface of the first portion of the semiconductor layers and electrically coupled to the lasing region in the first portion of the semiconductor layers;

a heating region including a second portion of the semiconductor layers and the active region, wherein the heating region is configured to generate heat, and wherein the heating region is thermally coupled to the lasing region such that heat generated by the heating region is conducted to the lasing region; and a heater electrode located on an outer surface of the second portion of the semiconductor layers and electrically coupled to the heating region in the second portion of the semiconductor layers, wherein the heater electrode is separated from the laser electrode;

an optical multiplexer optically coupled to the array of semiconductor laser diodes, the optical multiplexer being configured to combine the laser light at different respective channel wavelengths; and drive circuitry electrically coupled to the laser electrode and the heater electrode, the drive circuitry being configured to provide a laser drive signal to the lasing region and a heater drive signal to the heater region.

11. The optical transmitter of claim 10 wherein the semiconductor laser diodes include tunable distributed feedback (DFB) lasing regions.

12. The optical transmitter of claim 10 further comprising at least one thermoelectric cooler thermally coupled to the array of semiconductor laser diodes for cooling the laser diodes.

13. The optical transmitter of claim 10 wherein the optical multiplexer is an arrayed waveguide grating (AWG).

14. The optical transmitter of claim 10 wherein the channel wavelengths include ITU channels wavelengths.

15. A method of manufacturing a semiconductor laser diode, the method comprising:

providing a plurality of semiconductor layers forming an active region;

forming a lasing region in a first portion of the semiconductor layers and a heating region in a second portion of the semiconductor layers, the lasing region including a first portion of the active region and the heating region including a second portion of the active region;

depositing a laser electrode on an outer surface of the semiconductor layers in the first portion, wherein the laser electrode is electrically coupled to the lasing region in the first portion of the semiconductor layers;

depositing a heater electrode on an outer surface of the semiconductor layers in the second portion, wherein the heater electrode is electrically coupled to the heating region in the second portion of the semiconductor layers; and depositing at least one bottom electrode on an outer surface of the semiconductor layers opposite the laser electrode and the heater electrode.

16. The method of claim 15 wherein the semiconductor layers include at least one p-type semiconductor layer and at least one n-type semiconductor layer.

17. The method of claim 16 wherein the semiconductor layers further include an intrinsic layer forming the active region between the p-type semiconductor layer and the n-type semiconductor layer.

18. The method of claim 15 wherein forming the lasing portion and the heating portion includes:

forming at least one trench between the first portion and the second portion of the semiconductor layers;

depositing an insulating material in the trench and over an outer surface of the semiconductor layers; and removing first and second portions of the insulating material in the lasing region and the heating region, respectively, to allow the laser electrode and the heater electrode, respectively, to be deposited.

19. The method of claim 15 wherein forming the lasing portion further includes:

providing a back reflector and an exit reflector on each end of the first portion of the active region in to form a lasing cavity.

* * * * *